United States Patent
Shoji

(10) Patent No.: US 6,285,247 B1
(45) Date of Patent: *Sep. 4, 2001

(54) OPTIMIZED LOW VOLTAGE CMOS OPERATION

(75) Inventor: Masakazu Shoji, Somerset County, NJ (US)

(73) Assignee: Agere Systems Guardian Corporation, Miami Lakes, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,007

(22) Filed: Jan. 21, 1999

(51) Int. Cl.$^7$ ................................................ H03K 17/687
(52) U.S. Cl. ........................... 327/544; 327/437; 327/576
(58) Field of Search ..................................... 327/530, 576, 327/437, 566, 374, 544; 326/103

(56) References Cited

U.S. PATENT DOCUMENTS

| | | | |
|---|---|---|---|
| 4,259,715 | * | 3/1981 | Morokawa ............................. 331/57 |
| 4,264,874 | * | 4/1981 | Young ................................... 330/293 |
| 4,281,260 | * | 7/1981 | Moegen et al. ....................... 327/541 |
| 4,399,523 | * | 8/1983 | Gerber et al. ........................ 365/103 |
| 5,298,807 | * | 3/1994 | Salmon et al. ......................... 326/81 |
| 5,351,212 | * | 9/1994 | Hashimoto ........................... 365/207 |
| 5,530,392 | * | 6/1996 | Runas et al. .......................... 327/333 |
| 5,606,265 | * | 2/1997 | Sakata et al. ......................... 327/544 |
| 5,811,991 | * | 9/1998 | Takashima ............................. 326/97 |
| 5,838,164 | * | 11/1998 | Chen ..................................... 324/769 |
| 5,936,433 | * | 8/1999 | Holloway ............................... 327/75 |
| 6,020,227 | * | 2/2000 | Bulucea ................................ 438/194 |

OTHER PUBLICATIONS

Theory of CMOS digital Circuits and circuit Failures, by M. Shoji, Chapter 5—pp. 1 to 69 inclusive, 1992, Princeton University Press.

CMOS circuit Design, Layout and Simulation, By R. Jacob Baker, Harry W. Li, David E. Boyce, IEEE press, ISBN 0–7803–3416–7—section 11.2.2, pp. 210–212 inclusive, pp. 96–100, Bsim modelling, pp. 107–119, 1998.

* cited by examiner

*Primary Examiner*—Timothy P. Callahan
*Assistant Examiner*—Terry L. Englund
(74) *Attorney, Agent, or Firm*—Istrate Iomescu Jumbepatent.com

(57) ABSTRACT

Operation of CMOS integrated circuits at a reduced voltage are optimized. A digital system comprises a plurality of P-channel metal oxide field effect transistors and a plurality of N-channel metal oxide field effect transistors arranged in complementary symmetry pairs. The P-channel transistors have a PFET conduction threshold voltage. The N-channel transistors have an NFET conduction threshold voltage. The threshold voltages are determined by extrapolation from the (high) gate to source voltage. Each of the N-channel transistors is paired with a corresponding P-channel transistor. The pairing is arranged in complementary symmetry (CMOS). A power supply connected across one of the pair formed from N-channel and P-channel transistors arranged in complementary symmetry is set to a voltage equal to the sum of the PFET conduction threshold voltage and the NFET conduction threshold voltage.

4 Claims, 4 Drawing Sheets

OPTIMIZED LOW VOLTAGE CMOS OPERATION

FIELD OF INVENTION

This invention is in the field of Complementary Symmetry Metal Oxide Field Effect transistors (CMOS) digital integrated circuit structures and operation thereof.

BACKGROUND OF THE INVENTION

Complementary symmetry Metal Oxide Semiconductor (CMOS) structures for digital operation have arisen from the need to reduce power consumption during quiescent, OFF times while preserving high clock operating frequencies. The advantage of CMOS over other structures, in general, is that power is consumed only during transition times when individual Metal Oxide Semiconductor Field Effect Transistors (MOSFET) forming a CMOS pair switch from ON to OFF or from OFF to ON. Whenever a CMOS pair is either in the ON or OFF state, and not in a switching state, power dissipation is nominally zero. Thus, CMOS is well suited for digital operation where individual CMOS pairs forming, for example, a microprocessor logic circuit FETs may be in either the ON of OFF state for extended periods of time as part of normal operation.

While power dissipation may be negligible during either the ON or OFF steady state, CMOS pairs switching at hundreds of megahertz during normal circuit operation dissipate substantial power. This dissipation becomes of concern as the number of CMOS pairs per unit area of a substrate increase, as exemplified by shrinking circuit geometries approaching 0.1 micron. Thus, the combination of high pair density per unit area with increased switching speeds has typically forced the reduction of operating voltage for viable operation.

The prior art suggests reduction in power dissipation of dense CMOS circuits by unlimited reduction of the voltage supplied to the CMOS. Reduction in $V_{DD}$, the voltage supplied to the CMOS integrated circuit is exemplified by the history of voltage reductions made in accordance with circuit density. $V_{DD}$ has gone from the customary 5 volts, followed by 3.3 volts, then 1.8 volts, as exemplified by Texas Instrument's TMS320C67X line of processors. Other processors, operating at about 60 Mhz, operate at 0.9 volts to further reduce dynamic power dissipation. Some battery operated systems operate at a $V_{DD}$ of 1.6 volts.

The concept of voltage reduction for reducing power dissipation in the prior art, is exemplified in CMOS Circuit Design, Layout, and Simulation, By R. Jacob Baker, Harry W. Li and David E. Boyce, IEEE Press, ISBN 0-7803-3416-7. In this reference, section 11.2.2 suggests that dynamic power dissipation in a CMOS inverter is a function of the capacitance of the load driven by the inverter and the power supply voltage $V_{DD}$. Thus power dissipation comes from the current flow associated with the charge and discharge of the capacitive load imposed on the output of the inverter. Since a capacitive load requires $½CV_{DD}^2$ of energy to be charged and discharged, the prior art teaches that a reduction in CMOS operating voltage $V_{DD}$ will reduce dynamic power dissipation by a factor of $V_{DD}^2$. Furthermore, if a power delay product is to be used to characterize the speed of a digital process, only the switching delay from low to high and high to low is to be considered in conjunction with the average power as discussed in the same reference at equation 11.19.

Thus, the prior art has been teaching to reduce power supply voltage indefinitely for increased CMOS operating clock speed and increased pair density per unit area.

SUMMARY OF THE INVENTION

However, teaching away from the prior art, this invention shows that $V_{DD}$ cannot be lowered beneficially indefinitely below an optimal level.

The problem of operating CMOS integrated circuits at a reduced voltage are avoided in accordance with one aspect of the invention by operating a CMOS inverter at an optimal voltage. A digital system of this invention comprises a plurality of P-channel metal oxide semiconductor field effect transistors and a plurality of N-channel metal oxide semiconductor field effect transistors. The P-channel transistors have a PFET conduction threshold voltage. The N-channel transistors have an NFET conduction threshold voltage. The NFET and PFET threshold voltages are determined by extrapolation from the high gate to source voltage. Each of the N-channel transistors are paired with a P-channel transistor. The pairing is arranged in complementary symmetry (CMOS). A power supply connected across one of the pair formed from N-channel and P-channel transistors arranged in complementary symmetry is set to a voltage approximating the sum of the PFET conduction threshold voltage and the NFET conduction threshold voltage. This voltage is other than 5 volts, 3.3 volts, 1.8 volts and 0.9 volts.

BRIEF DESCRIPTION OF THE DRAWING

These and other features of the invention will become apparent from the following description and claims, when taken with the accompanying drawings, wherein similar reference characters refer to similar elements throughout, and in which:

DETAILED DESCRIPTION

Figure 1:
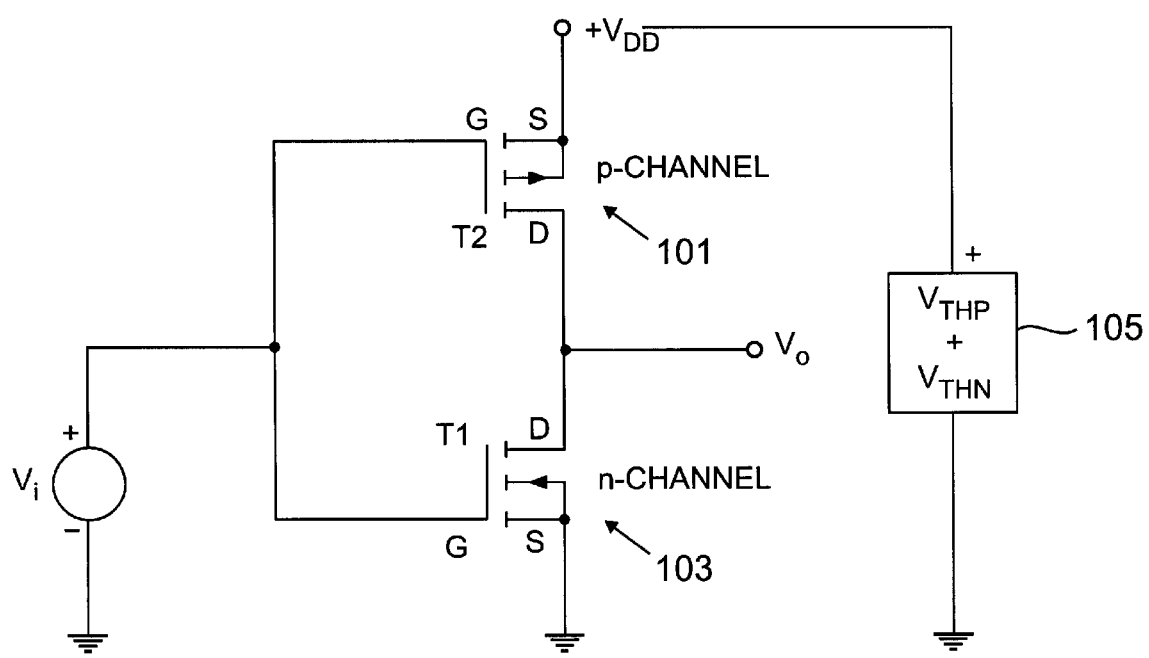
FIG. 1 is a typical CMOS exemplary inverter.

FIG. 1 shows a typical CMOS inverter relevant to the invention formed from a pair comprising a P channel field effect transistor 101 and an N channel transistor 103. The pair is supplied with supply voltage VDD from power supply 105 and has an output $V_o$. The P channel FET 101 and N channel FET 103 are joined at their drains, and the series combination is connected from $V_{DD}$ to ground. The output $V_o$ is taken at the common drains. Typically, for a digital application, both transistors 101 and 103 operate in the enhancement mode. In accordance with this invention, power supply 105 is optimized for the structure shown in FIG. 1 by setting its voltage output to a value equal to the sum of $V_{THN}$ and $V_{THP}$.

The input voltage Vi in FIG. 1 swings over the range of $V_{DD}$ to ground. When $V_i$ is in the neighborhood of ground, NFET 103 will be OFF, while PFET 101 will be on, thus making $V_o$ approximately equal to $V_{DD}$. Conversely, when $V_i$ is almost $V_{DD}$, NFET 103 will be on, while PFET 101 will be OFF, and $V_o$ is almost at ground.

Figure 2:
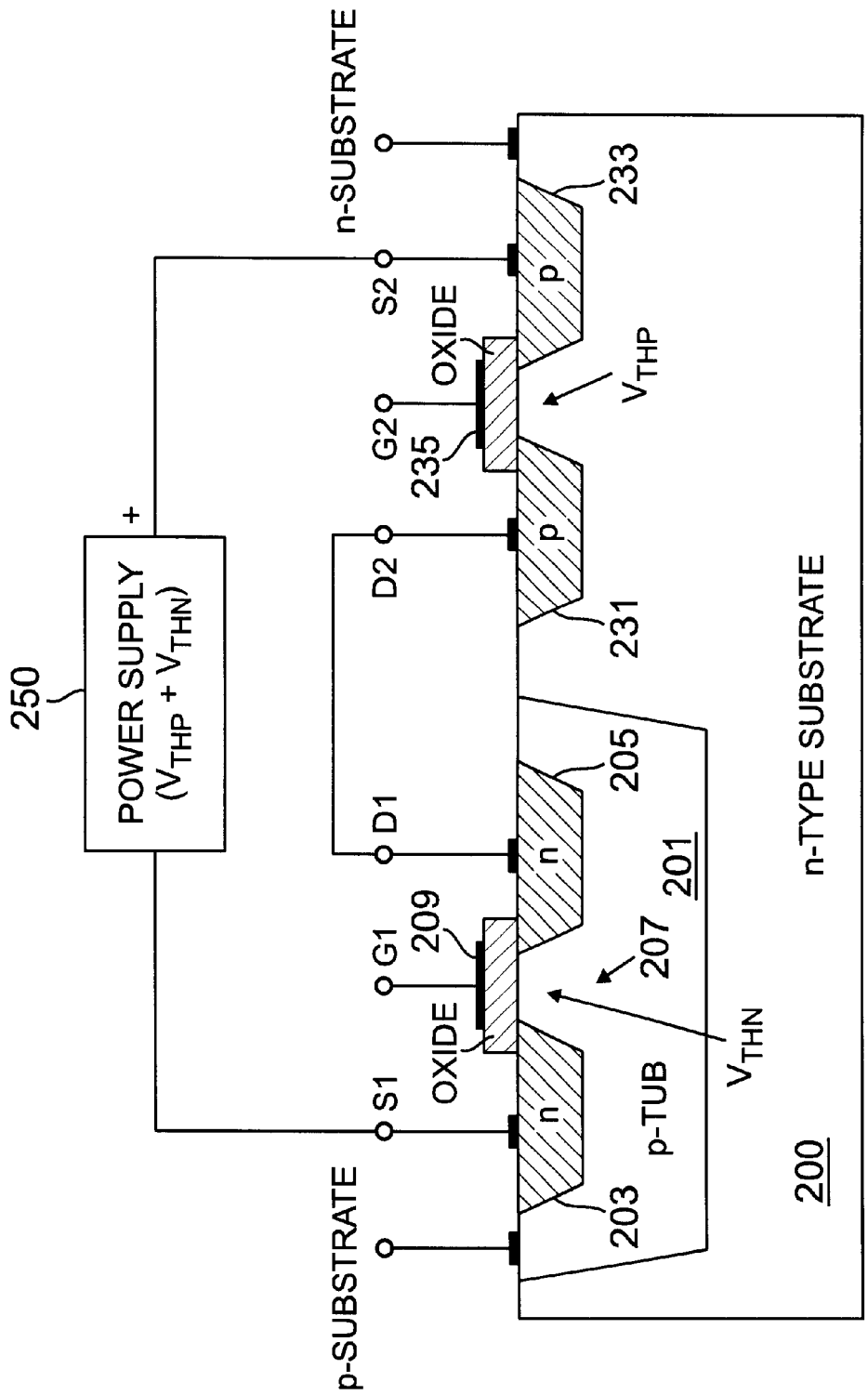
FIG. 2 shows a cross-section of typical N and P diffusions required to create an N-FET and P-FET pair, on the same substrate to implement the CMOS inverter of FIG. 1.

In fabricating the structure of the CMOS inverter in FIG. 1, two N-type regions 203 and 205 are diffused into a P-type tub 201 formed on N-type substrate, as shown in FIG. 2. One such N type region is to become the source, the other the drain of the N-channel transistor. As shown in FIG. 2, P-type tub 201 is diffused within N-type substrate 200. N regions 203 and 205 are diffused within P-tub 201. Regions 203 and 205 are bridged by a channel 207 covered by oxide 209, forming the gate of a P-channel FET. Similarly, P regions 231 and 233 diffused within the N-type substrate 200, along with gate 235 form a P-channel FET. The mobility of carriers in the P-channel device is smaller than the mobility carrier in the N-channel device generally by a factor of 2 or 3. Thus, to match the operating characteristics of the transistors, the width to length ratio of the channel for the P-channel device has to be correspondingly larger by a factor of 2 or 3. Power supply 250, set to a fixed voltage computed from the sum of $V_{THN}$ and $V_{THP}$, will supply this structure with an efficient, fixed supply voltage.

Figure 3:
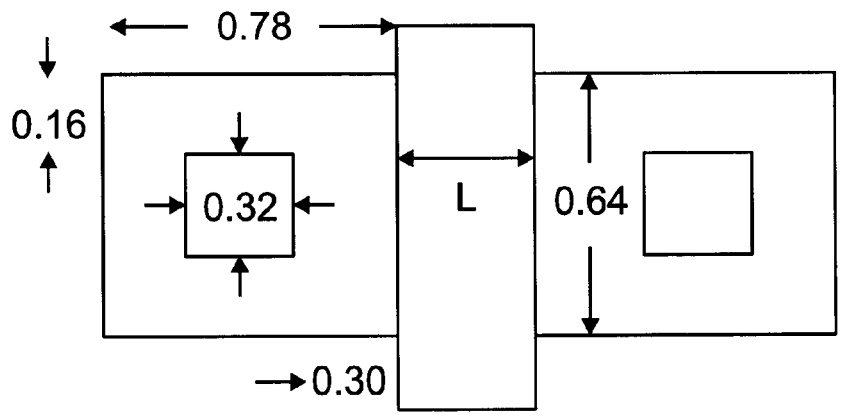
FIG. 3 shows a typical 0.25 micron geometry N-FET
Figure 4:
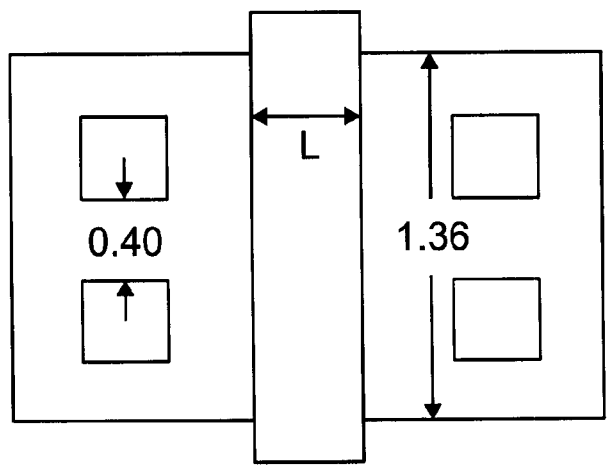
FIG. 4 shows a typical 0.25 micron geometry P-FET.

For 0.25 micron technology, as illustrated in FIG. 3, the N-channel device is approximately half the size of the P-channel device of FIG. 4. In FIG. 3, the dimension L, showing channel length, is 0.24 microns, while the dimension L in FIG. 4, also showing channel length is 0.28 microns. The other dimensions shown in FIG. 3 and 4 defining the size of the N and P regions are in microns.

The amount of power dissipated by the exemplary inverter described in FIGS. 1, 2, 3, and 4 is thought by the prior art to be a function of $VD_{DD}^2$. Thus, to reduce power dissipation, $V_{DD}$ in the prior art has steadily decreased stepwise from 5 volts, then 3.3, followed by 1.8 and finally 0.9 volts. The voltage reduction has been unconditional, that is, no limit has been suggested to the reduction in voltage. However, the prior art approach only considers the capacitive effects of the load influencing dissipation in an inverter and does not take into effect:

1) input power delivered to $V_i$;
2) power delivered from $V_o$ (fan-out) by the inverter or other gates using the same CMOS structure; and
3) time delay between input applied to $V_i$ and change in state of output $V_o$, the gate delay time.

As was found by experimentation, and proven by circuit theory, as $V_{DD}$ is reduced, the gate delay time becomes longer. Generally, the conduction threshold voltages of the N-FETs ($V_{THN}$) and of the P-FETs ($V_{THP}$) are kept at the same level to prevent excessive leakage current through the FETs that are turned off. If the ratio $$\frac{V_{THN}}{V_{DD}}$$

and $$\frac{V_{THP}}{V_{DD}}$$

are the same, the delay time is also about the same as discussed in Theory of CAMOS Digital Circuits and Circuit Failures by M. Shoji, Chapter 5, Princeton University Press, 1992. Unilateral reduction of $V_{DD}$, while maintaining the same $V_{THN}$ and $V_{THP}$ results in the inevitable delay increase. Thus reducing $V_{DD}$ without constraint introduces increasing time delays in inverter response to the point of rendering the inverter essentially inoperative.

Therefore, a trade-off exists between reducing $V_{DD}$, and speed of operation (clock rate) of the circuit.

Figure 5:
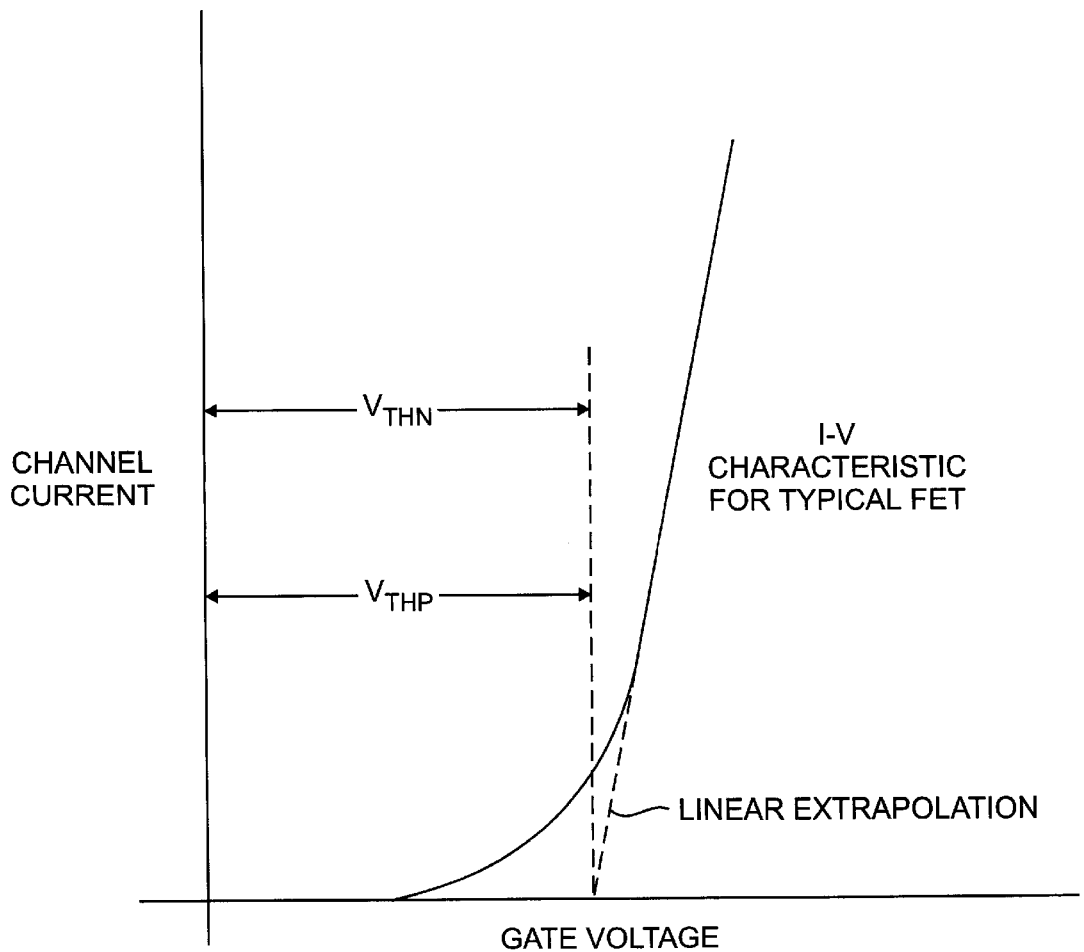
FIG. 5 shows the determination of $V_{THN}$ and $V_{THP}$ as applied in this invention.

The inventor has found that $V_{DD}$ can only be reduced to an optimum point, beyond which further voltage reductions impact circuit operation beyond the benefits offered by voltage reduction. To compute this optimum point, the following expression, determined theoretically is used:

$$F(V_{DD}) = \left[\frac{V_{DD}}{2.5}\right]^2 \left[\frac{A}{(V_{DD} - V_{th})^2} + \frac{B}{V_{DD} - V_{th}}\right] \quad (1)$$

where $V_{th}$ are in general, equal to the average of the threshold voltages $V_{THN}$ and $V_{THP}$. $V_{THN}$ and $V_{THP}$ are defined by fitting the FET current voltage (I-V) characteristics as described in FIG. 5. In FIG. 5, the channel current is plotted with respect to the gate voltage, assuming a fixed drain voltage set to the $V_{DD}$ of the technology. $V_{THN}$ and $V_{THP}$, are then determined from the intersection of the linearly interpolated part of the I-V curve with the gate voltage axis, as shown. The "high side" threshold voltage, $V_{THN}$, is the threshold voltage $V_{th}$ at an the operating point when the source to drain current is at its high value (saturation). When a transistor pair is operated in a complementary configuration, at some point of operation, both transistors will conduct at their saturation current. The saturation current is an operating point determined by other current limiters in series with the drain and source of one of the transistors in a digital circuit. FIG. 5 of the present application shows the slope of the high (saturation) current being extended to intersect the gate voltage axis where the source to drain current is zero. At that intersection, $V_{THN}$ can be found for the NPN transistor, and $V_{THP}$ can be found for the PNP transistor. In this invention $V_{THN}$ and $V_{THP}$ are close to the values given by FET device theory (as exemplified by equation 8 below), but they are adjusted close together by processing technology, but are not, generally, exactly the same. It is important to note that $V_{THN}$ and $V_{THP}$ used with equation 1 are different from $V_{THN}$ and $V_{THP}$ computed in equation 8 below. In contrast to the values given in equation 8, $V_{THN}$ and $V_{THP}$ of this invention are a modified version, as observed from the high gate voltage side of the FET, and computed in accordance with the procedure of FIG. 5. This is because the delay formula in equation (1) uses $V_{th}$ defined this way. This procedure determines NFET and PFET threshold voltages by extrapolation from the high gate to source voltage of the particular NFET or PFET and calls for extending the essentially linear portion of the I-V curve until it intersects the gate voltage axis. This intersection on the gate voltage axis determines the value of $V_{THN}$ and $V_{THP}$. The first part of equation 1, $$\left[\frac{V_{DD}}{2.5}\right]^2$$

is proportional to the power consumption and was generally known as described supra. The second part of the equation, $$\left[\frac{A}{(V_{DD} - V_{th})^2} + \frac{B}{V_{DD} - V_{th}}\right]$$

is related to the delay time. The delay time equation is generally disclosed in the Shoji reference cited above. However, the combination of the power equation and the delay time aspect, and the insight gained from the combination, were not disclosed in the prior art. $F(V_{DD})$ defined in equation 1 is thus the figure of merit of a CMOS circuit design, and has to be minimized for optimum operation.

Thus, the dependence of the function F on $V_{DD}$ can be described by a function of the type:

$$f(x) = x^2 \left[ \frac{1}{x - x_0^2} + \frac{\alpha}{x - x_0} \right] \quad (2)$$

Computing a minimum for above equation, we set the derivative to zero, thus $$f'(x) = \frac{x(\alpha x^2 - 3\alpha x_0 + 2\alpha x_0^2)}{(x - x_0)^3} = 0 \quad (3)$$

solving for the minimum $x_{min}$ yields $$x_{min} = \frac{3\alpha x_0 + \sqrt{\alpha^2 x_0^2 + 8\alpha x_0}}{2\alpha} \quad (4)$$

Solving the above gives a positive and a negative result. Ignoring the negative sign option as unrealistic, and since $\alpha \gg 1$ generally for any submicron CMOS design, we have $$x_{min} \approx 2x_0 \quad (5)$$

The maximum energy efficiency thus occurs at about $$V_{DD} = 2V_{th} = 1.6 \text{ volts} \quad (6)$$

Furthermore, the CMOS is at its most efficient when $$V_{DD} \approx V_{THN} + V_{THP} \quad (7)$$

where
$V_{THN}$ is the NFET conduction threshold voltage and
$V_{THP}$ is the PFET conduction threshold voltage.

Thus the most efficient CMOS circuit will satisfy above equation, and doping, determinative of $V_{THN}$ and $V_{THP}$ can be chosen to accommodate a particular IC process/voltage combination for optimized operation.

It should be noted that $V_{THN}$ and $V_{THP}$ are computed in the prior art using parameters of the Berkeley Short Channel Igfet Model (BSIM1) SPICE model for N-channel and P-channel MOS transistors. These are different from the $V_{THN}$ and $V_{THP}$ used in this invention. In the BSIM1 model, $V_{THN}$ is determined from $$V_{THN} = VFB + PHI + K1\sqrt{PHI + V_{SB}} - K2(PHI + VSB) \quad (8)$$

where
VFB is the flat band voltage;
PHI is the surface inversion potential;
K1 is the body effect coefficient;
$V_{SB}$ is source to base voltage; and
K2 is drain/source depletion charge–sharing coefficient.

For VTHP, the appropriate parameters are substituted in the expression for $V_{THN}$. This is in accordance with BSIM1 as detailed by J. R. Pierret, *A MOS Parameter Extraction program for the BSIM model* Electronics research laboratory, University of California, Berkeley, Calif. 94720. Memorandum number UCB/ERL M84/99 Nov. 21, 1984. SPICE is detailed by G. Massobrio and P. Antognetti, in *Semiconductor Device Modeling with SPICE* 2nd edition, McGraw Hill, 1993 ISBN 0-07-002469-3. Conversely, in this invention $V_{THN}$ and $V_{THP}$ are computed in accordance with FIG. 5.

It is further understood that $V_{THN}$ and $V_{THP}$ can be controlled by the doping process utilized during the manufacture of the CMOS circuit. Thus, a power supply voltage can be chosen first. Then, CMOS gates are manufactured by controlling the value of $V_{THN}$ and $V_{THP}$ to fit the voltage rating of the power supply.

All documents cited herein are incorporated by reference in their entirety.

Although presented in exemplary fashion employing specific embodiments, the disclosed structures are not intended to be so limited. For example, although only an inverter was detailed, those skilled in the art can extend the concepts presented herein to other digital gates such as full adders, carry propagators, NAND and NOR gates, ring counters, digital phase locked loops, and the like. Equation 1 herein is sufficiently general to cover all cases. This generality originates from the delay dependence on $V_{DD}$ and $V_{THP}$, $V_{THN}$ and has proved to be accurate experimentally by the inventor for CMOS gates and subsystems.

Those skilled in the art will also appreciate that numerous changes and modifications could be made to the embodiment described herein without departing in any way from the invention. Examples are power supply voltages close to the recited values that still allow efficient operation. These changes and modifications and all obvious variations of the disclosed embodiment are intended to be embraced by the claims to the limits set by law.

What is claimed is:

1. An optimized digital system comprising:

a plurality of metal oxide field effect transistors each of said transistors having a drain, a source, a gate, a channel current, and a gate voltage, said channel current and said gate voltage related by an IV plot, said transistors forming complementary symmetry pairs, each of said transistors having a high side conduction threshold voltage, said threshold voltage set by said channel current flowing between said drain and said source, said channel current at an operating point in a digital circuit where said current is approaching saturation, said high side conduction threshold voltage computed from the extension of a slope of said channel current at said operating point in said IV plot to intersect said gate voltage at a point on said IV plot where said channel current is zero; and a pre-computed voltage connected across said plurality of metal oxide field effect transistors, said precomputed voltage optimized for minimum time delay and minimum power dissipation across said plurality of metal oxide field effect transistors, said pre-computed voltage nominally equal to the sum of two of said high side conduction threshold voltages, said pre-computed voltage other than nominal 5 volts, 3.3 volts, 1.8 volts, 1.6 volts and 0.9 volts.

2. A digital system comprising:

a P-channel metal oxide semiconductor field effect transistor and a N-channel metal oxide semiconductor field effect transistor, said N-channel transistor paired with said P-channel transistor, said pairing arranged in complementary symmetry, each of said P-channel and N-channel transistors having a drain, a source, a gate, a channel current, and a gate voltage, said channel current and said gate voltage related by an IV plot, said P-channel transistor having a PFET high side conduction threshold voltage, said N-channel transistor having a NFET high side conduction threshold voltage, said PFET high side conduction and said NFET high side conduction threshold voltages induced by said channel current flowing between said drain and said source, said channel current determined by an operating point in a digital circuit where said current is approaching saturation, said high side conduction threshold voltages computed from the extension of a slope of said channel current at said operating point in said IV plot to intersect said gate voltage at a point on said TV plot where said channel current is zero; and a pre-computed voltage connected across said pair of N-channel and P-channel transistors arranged in said complementary symmetry, said pre-computed voltage set nominally equal to the sum of said PFET conduction threshold voltage and said NFET conduction threshold voltage, said precomputed voltage optimized for minimum time delay and minimum power dissipation across said N-channel and P-channel metal oxide field effect, transistors, said pre-computed voltage other than 5 volts, 3.3 volts, 1.8 volts, 1.6 volts, and 0.9 volts.

3. A digital system comprising:

a P-channel metal oxide semiconductor field effect transistor having a channel length of 0.28 microns, and a N-channel metal oxide semiconductor field effect transistor having a channel length of 0.24 microns, said P-channel transistor having a PFET high side conduction threshold voltage, and said N-channel transistors having an NFET high side conduction threshold voltage, said P-channel transistor paired with said N-channel transistor in complementary symmetry, each of said transistors having a drain, a source, a gate, a channel current, and a gate voltage, said channel current and said gate voltage related by an IV plot, said threshold voltages induced by said channel current flowing between said drain and said source, said channel current determined by an operating point in a digital circuit where said current is approaching saturation, said high side PPET and NFET conduction threshold voltages computed from the extension of a slope of said channel current at said operating point in said IV plot to intersect said gate voltage at a point on said IV plot where said channel current is zero; and a pre-computed voltage connected across said paired N-channel and P-channel transistors in complementary symmetry, said precomputed voltage nominally equal to the sum of said PFET conduction threshold voltage and said NFET conduction threshold voltage, said precomputed voltage optimized for minimum time delay and minimum power dissipation across said N-channel and P-channel metal oxide field effect transistors, said pre-computed voltage other than 5 volts, 3.3 volts, 1.8 volts, 1.6 volts, and 0.9 volts.

4. A method for setting the nominal value of a pre-computed voltage for operating a digital system comprising the steps of:

pairing a P-channel metal oxide field effect transistor and a N-channel metal oxide field effect transistor in complementary symmetry wherein said P-channel transistor has a high side PFET conduction threshold voltage, and said N-channel transistor has a high side NFET conduction threshold voltage;

each of said transistors has a drain, a source, a. gate, a channel current, and a gate voltage, said channel current and said gate voltage related by an IV plot, said threshold voltage induced by said channel current flowing between said drain and said source, said channel current determined by an operating point in a digital circuit where said channel current is approaching saturation;

computing said high side PFET and NFET conduction threshold voltages from an extension of a slope of said channel current at said operating point in said IV plot to intersect said gate voltage a point on said IV plot where said channel current is zero; and setting said precomputed voltage connected if across said paired N-channel and P-channel transistors in said complementary symmetry, nominally equal to the sum of said PFET high side conduction threshold voltage and said NFET high side conduction threshold voltage, said precomputed voltage optimized for minimum time delay and minimum power dissipation across said P-channel and said N-channel metal oxide field effect transistors.

* * * * *